United States Patent [19]

Shakuda

[11] Patent Number: 5,477,063
[45] Date of Patent: Dec. 19, 1995

[54] SEMICONDUCTOR LIGHT EMITTING DEVICE WITH GROUP II-IV AND III-V SEMICONDUCTORS

[75] Inventor: Yukio Shakuda, Kyoto, Japan

[73] Assignee: Rohm Co., Ltd., Kyoto, Japan

[21] Appl. No.: 260,982

[22] Filed: Jun. 15, 1994

[30] Foreign Application Priority Data

Jun. 17, 1993 [JP] Japan .................. 5-145844

[51] Int. Cl.$^6$ .................................................. H01L 33/00
[52] U.S. Cl. ........................... 257/94; 257/96; 257/97; 257/103; 257/200; 372/45; 372/46; 372/48
[58] Field of Search ..................... 257/94, 96, 97, 257/103, 95, 200; 372/45, 46, 48

[56] References Cited

U.S. PATENT DOCUMENTS

| | | | |
|---|---|---|---|
| 4,329,660 | 5/1982 | Yano et al. | 257/94 X |
| 5,324,963 | 6/1994 | Kamata | 257/94 X |

FOREIGN PATENT DOCUMENTS

| | | | |
|---|---|---|---|
| 55-123191 | 9/1980 | Japan | 372/46 |
| 5606480 | 1/1991 | Japan | 257/94 |
| 3292778 | 12/1991 | Japan | 257/96 |
| 5090706 | 4/1993 | Japan | 372/46 |

Primary Examiner—William Mintel
Attorney, Agent, or Firm—Nikaido Marmelstein Murray & Oram

[57] ABSTRACT

In a semiconductor light emitting device of a group II-V semiconductor, a current blocking layer for passing the current only through a central stripe area is formed in one of the two light clad layers sandwiching an active layer, so that the light emission efficiency improves and a light guiding path is provided. In a process for forming each layer on a substrate through epitaxial growth, the central stripe area is formed by etching the current blocking layer.

5 Claims, 6 Drawing Sheets

SEMICONDUCTOR LIGHT EMITTING DEVICE WITH GROUP II–

BACKGROUND OF THE INVENTION

1. Field of the Invention

The present invention relates to a semiconductor light emitting device and its manufacturing method. The light emitting device is used as a semiconductor laser device, as a signal reading and writing light emitting device for use in a compact disk (CD) player and a laser disk (LD) player, as a light emitting device for use in a bar code reader, and as a blue light emitting device (LED) for use in displays of other various electronic apparatuses.

2. Description of the Prior Art

FIG. 1 shows a blue light emitting semiconductor layer device of ZnSe as an example of a conventional semiconductor light emitting device. In the semiconductor laser device shown in this figure, a group II-VI semiconductor of ZnCdSSe or MgZnCdSSe is grown on an N-type GaAs substrate 21. A buffer layer 22 made of N-type ZnSe, a clad layer 23 made of N-type ZnSSe, an active layer 24 made of ZnCdSe, a clad layer 25 made of P-type ZnSSe and an electrode contact layer 26 made of P-type ZnSe are formed in this order in lamination.

On the electrode contact layer 26 which is the top layer, a metal such as Au is directly deposited to form an electrode 27. Similarly, an electrode 28 is formed on the outer surface of the N-type substrate 21. The clad layers 23 and 25 made of N-type and P-type ZnSSe, respectively, function to prevent the diffusion of light caused at the active layer 24.

In a device having such a P-N junction structure of the group II-VI semiconductor, when a bias voltage is applied between the electrodes 27 and 28 in a forward direction, carriers injected by the current are blocked in the active layer 24, so that an induced emission occurs vigorously. When the exciting current exceeds a threshold value, light resonates between the parallel end surfaces of the active layer 24 to cause a laser oscillation. In this case, to improve the output performance of the device, it is important to increase the ratio of the current which contributes to the light emission.

That is, since the light emitting area of the active layer 24 is limited to a central stripe light emitting area 24a, to increase the ratio of the current which contributes to the light emission, it is desirable to limit the spread of the current in a horizontal direction (direction parallel to the active layer 24) to concentrate as much current as possible in the central light emitting area 24a of the active layer 24.

In a conventional device, the current is concentrated in the following manner: In forming the electrode 27 on the P-type buffer layer 26 which is the electrode contact layer, after a metal is deposited, only a stripe area located opposite the central light emitting area 24a of the active layer 24 is left as the electrode 27 and the other portions are removed by etching, thereby restricting the horizontal spread of the current flowing from the electrode 27 to the active layer 24.

In this structure, however, since there is a considerable distance between the electrode 27 and the active layer 24 because of the presence of the clad layer 25 and the electrode contact layer 26 therebetween, the current spreads as shown by the arrows L' before it reaches the active layer 24. As a result, the current also reaches the outside of the central light emitting area 24a of the active layer 24.

For this reason, the ratio of the current which flows through the central light emitting area 24a of the active layer 24 to contribute to the light emission is largely reduced. Consequently, to obtain a necessary current density, a high voltage has to be applied between the electrodes. This not only increases the power consumption but also increases the generation of heat. As a result, the temperature characteristic receives a bad influence.

To restrain the spread of the current to solve these problems, the distance between the electrode 27 and the active layer 24 may be decreased by reducing the thickness of the P-type clad layer 25 and the P-type buffer layer (electrode contact layer) 26 as much as possible. However, in actuality, since the thicknesses of the P-type layers 25 and 26 have to be at least 1 μm to decrease the influence by the absorption and reflection of light caused at the active layer 24, it is difficult to decrease the distance between the electrode 27 and the active layer 24 under present circumstances.

The clad layer 24 blocks the light travelling in a vertical direction from the electrode 27 toward the active layer 24. However, in the horizontal direction, there is no difference in refractive index and light absorption since there is only one layer made of only one component, i.e. P-type ZnSSe. Therefore, there is substantially no light guiding path in the horizontal direction, and the guiding of the light in the horizontal direction is made only by concentrating the current. For this reason, to control the angle of spread of light, there is no other way than regulating the distribution of spread of the current. In such a way, however, it is difficult to minutely control the angle of spread of light.

SUMMARY OF THE INVENTION

An object of the present invention is to provide a semiconductor light emitting device and its manufacturing method. In the semiconductor light emitting device, the power consumption is reduced and the temperature characteristic is improved by increasing the ratio of the current which contributes to the light emission by providing in the clad layer a structure for preventing the spread of the current, and the light guiding path in the horizontal direction in the clad layer is minutely controlled.

To achieve the above-mentioned object, in a semiconductor light emitting device of the present invention, a group II-VI semiconductor of ZnCdSSe or MgZnCdSSe is grown on a GaAs substrate. A first clad layer of the same conductivity type of the conductivity type of the GaAs substrate, an active layer, a second and a third clad layers of a different conductivity type from the conductivity type of the first clad layer, and an electrode contact layer are formed in this order in lamination. Electrodes are formed on the outer surfaces of the electrode contact layer and the GaAs substrate.

Between the second and third clad layers, a GaAs current blocking layer of a different conductivity type from the conductivity type of the second and the third clad layers is provided on each side of the surface of the second clad layer so that a central stripe area located opposite a central light emitting area of the active layer is left.

According to this structure, the current flowing between the electrodes through the active layer flows, at the layer level where the GaAs current blocking layer is formed, only through the central stripe area where no current blocking layer is formed. Therefore, the current flows in concentration through the central light emitting area of the active layer which is located opposite the central stripe area mentioned above. Further, since the GaAs current blocking layer and the active layer are much closer to each other than in the conventional device, the spread of the current is restrained greatly, so that most of the current contributes the light emission.

Further, since the GaAs constituting the current blocking layers and the group II-VI semiconductor constituting the second and third clad layers are different in refractive index, the central strip area between the current blocking layers functions as a light guiding path in the horizontal direction because of the difference in light absorption therebetween. As a result, the spread of light in the horizontal direction is minutely controlled by adjusting the width of the central stripe area.

The semiconductor light emitting device according to the present invention is manufactured by the following method: First, a group II-VI semiconductor of ZnCdSSe or MgZnCdSSe is grown on the GaAs substrate to form the first clad layer of the same conductivity type as the conductivity type of the GaAs substrate, the active layer, and the second clad layer of a different conductivity type of the conductivity type of the first clad layer in this order in lamination. Then, on the entire surface of the second clad layer, GaAs of a different conductivity type from the conductivity type of a second clad layer is grown to form a GaAs layer.

By removing the central stripe area located opposite the central light emitting area of the active layer in the Gas layer by etching, the GaAs current blocking layer is formed on each side of the stripe area. Then, the group II-VI semiconductor is grown on the surfaces of the GaAs current blocking layers and on a portion of the second clad layer which is exposed to the central stripe area, thereby forming the third clad layer of the same conductivity type as the conductivity type of the second clad layer.

Preferably, the growth of the GaAs current blocking layer is performed at a substrate temperature lower than a substrate temperature at which the group II-VI semiconductor is grown.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
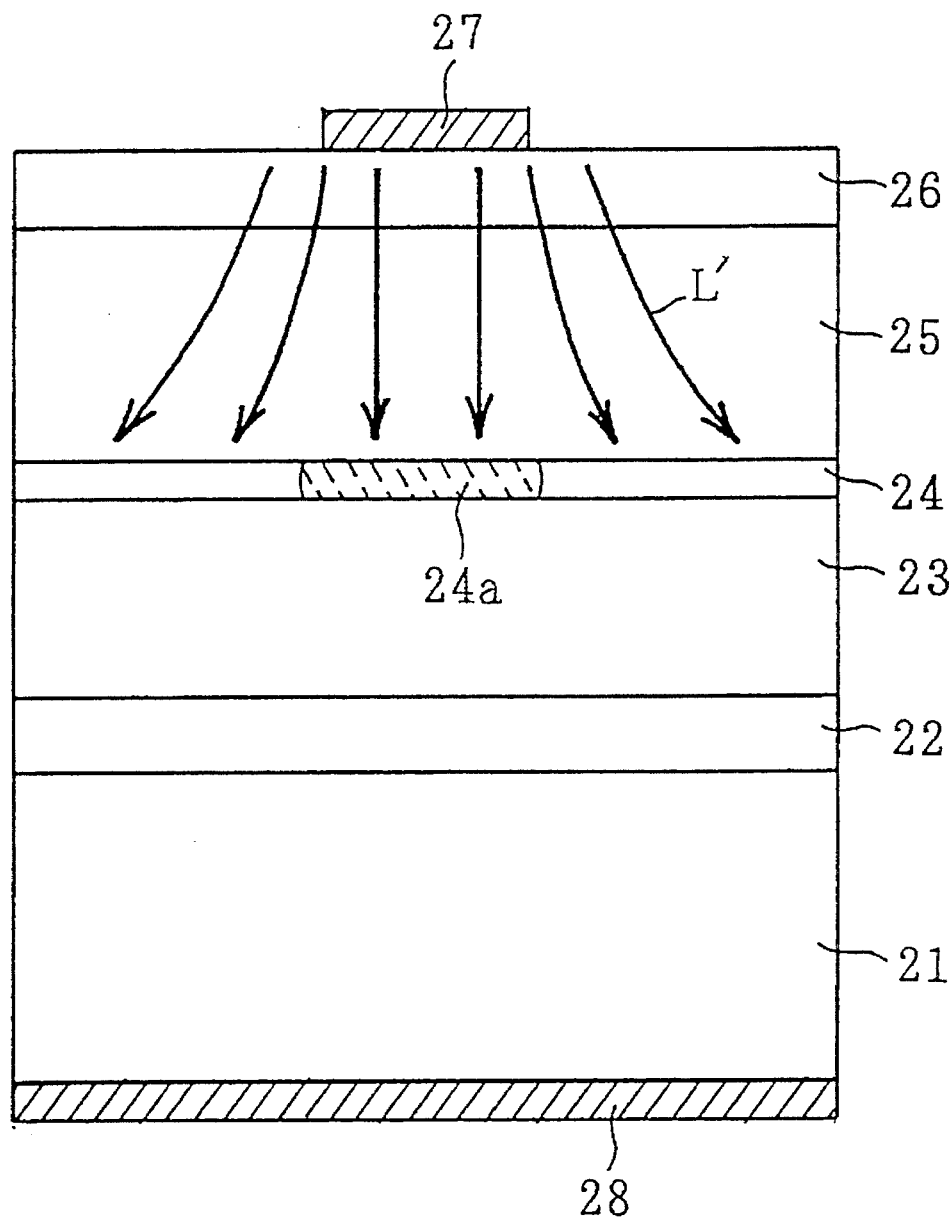
FIG. 1 is a cross-sectional view schematically showing the structure of a conventional semiconductor laser device.
Figure 2:
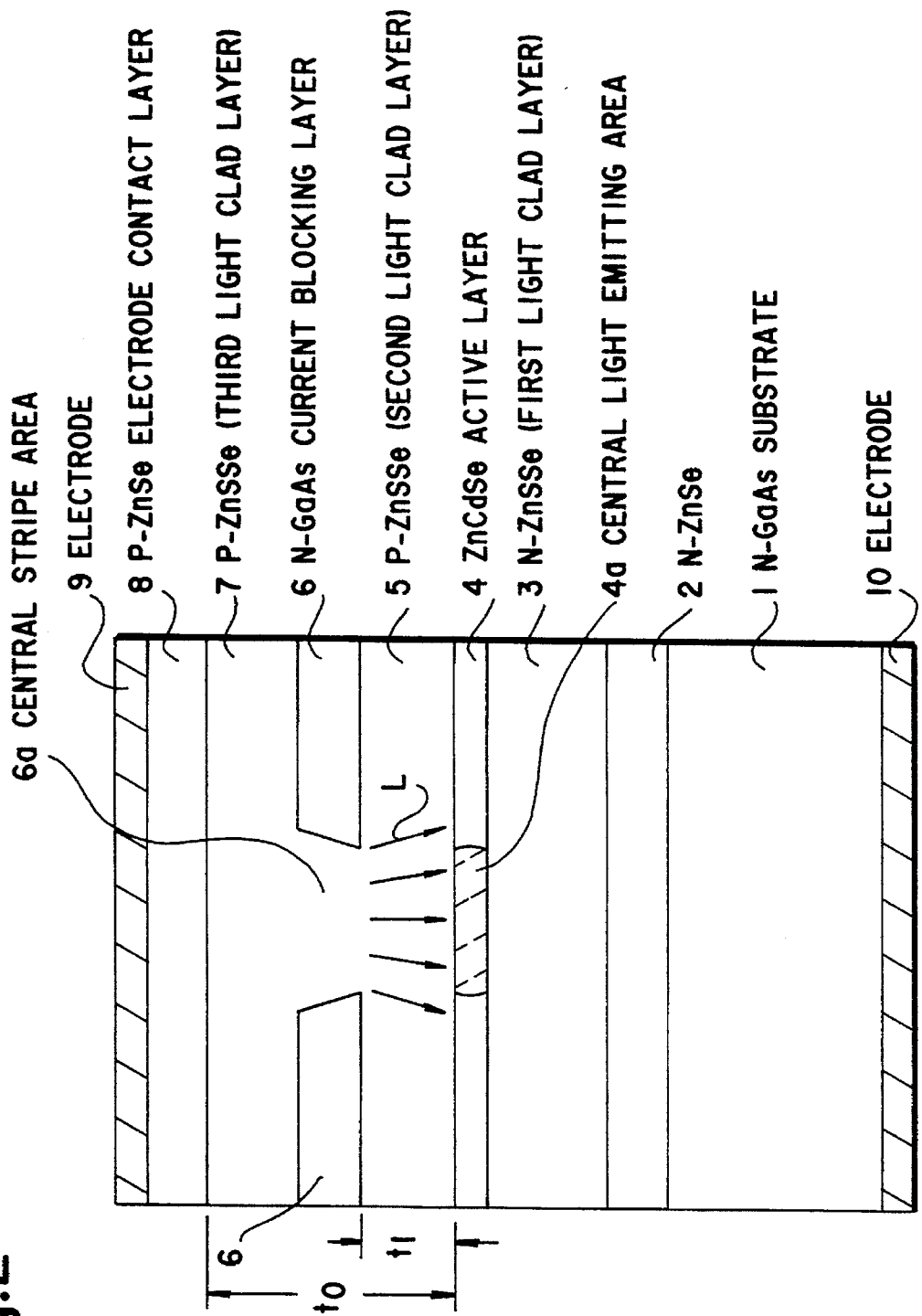
FIG. 2 is a cross-sectional view schematically showing a first embodiment of the present invention.

Hereinafter, embodiments where the present invention is employed in a semiconductor laser device will be described with reference to the drawings. FIG. 2 schematically shows a first embodiment of the present invention. The device shown in this figure is a blue light emitting semiconductor laser where a P-N junction structure including a plurality of layers is formed on an N-type GaAs substrate 1 by epitaxially growing a group II-VI semiconductor of ZnCdSSe.

Specifically, a buffer layer 2 made of N-type ZnSe, a first clad layer 3 made of N-type ZnSSe, an active layer 4 made of ZnCdSe and a second clad layer 5 made of P-type ZnSSe are formed on the N-type GaAs substrate 1 in this order. On the second clad layer 5, a third clad layer 7 is formed with subsequently-described N-type GaAs current blocking layers 6 between. On the third clay layer 7, an electrode contact layer 8 is formed. On the entire outer surfaces of the electrode contact layer 8 and the N-type GaAs substrate 1, electrodes 9 and 10 are formed, respectively, by depositing a metal such as Au.

The third clad layer 7 which is made of P-type ZnSSe like the second clad layer 5 constitutes a P-type clad layer together with the second clad layer 5. Likewise, the first clad layer 3 constitutes an N-type clad layer. The electrode contact layer 8 made of P-type ZnSe constitutes a buffer layer.

In the semiconductor laser device having the above-described structure, when a bias voltage is applied between the electrodes 9 and 10 in a forward direction, the current flows from the electrode 9 to the active layer 4 by way of the electrode contact layer 8, the third clad layer 7 and the second clad layer 5. This current causes holes to flow from the second and third clad layers 5 and 7 constituting the P-type semiconductor layer to the active layer 4, and causes electrons to flow from the first clad layer 3 constituting the N-type semiconductor layer to the active layer 4.

By the injection of the carriers, the recombination occurs of the electrons and holes which are blocked in the active layer 4 where the energy level is low, so that natural light is emitted from a central light emitting area 4a of the active layer 4. When the exciting current exceeds a threshold value, the light emission of the active layer 4 is changed from the natural light emission to an induced emission, so that light resonates between the parallel end surfaces of the active layer 4 to cause a laser oscillation.

Figure 3:
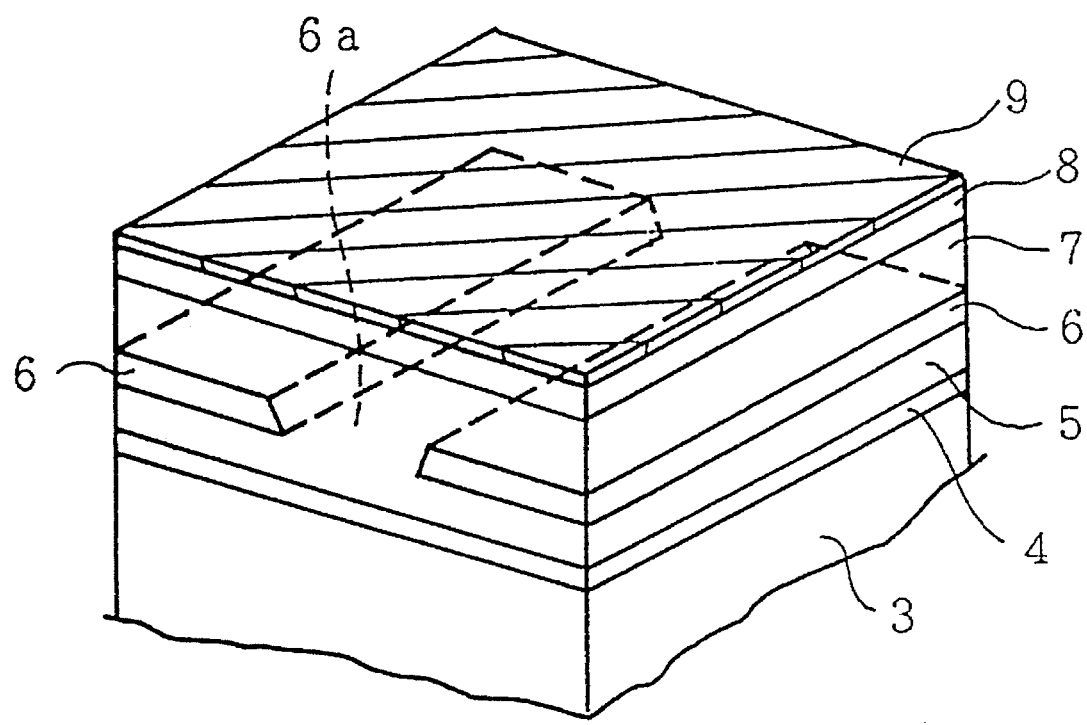
FIG. 3 is a perspective view showing a relevant portion of the first embodiment.

FIG. 3 shows the upper half of the device where the N-type GaAs current blocking layer 6 is formed. As shown in FIGS. 2 and 3, the N-type GaAs current blocking layer 6 is formed between the second clad layer 5 and the third clad layer 7 on each side of the surface of the second clad layer 5 so that a central stripe area 6a is left. The central stripe area 6a is located opposite the central light emitting area 4a. The third clad layer 7 is integrated with the second clad layer 5 through the central stripe area 6a.

A thickness $t_1$ of the second clad layer 5 is set to be smaller than one third of a thickness $t_0$ of the whole clad layer constituted by the second and third clad layers 5 and 7, so that the current blocking layers 6 and the central stripe area 6a are as close to the active layer 4 as possible. Specifically, the thickness $t_0$ of the whole clad layer is approximately 1.5 μm, whereas the thickness $t_1$ of the second clad layer 5 is less than 0.5 μm.

In this structure, the current flows from the electrode 9 to the electrode 10 by way of the central stripe area 6a, as shown by the arrows L in FIG. 2. The N-type GaAs blocking layer 6 prevents the current from spreading in the horizontal direction. Therefore, the current flows through the central light emitting area 4a of the active layer 4 in concentration.

Figure 4:
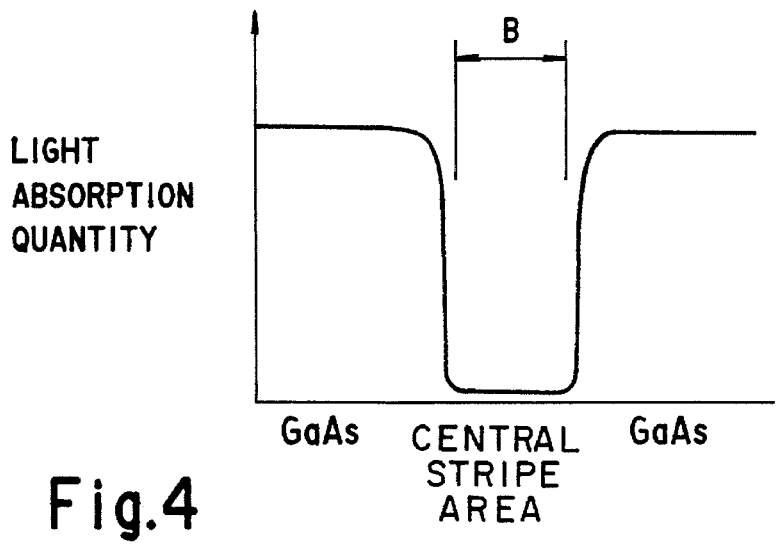
FIG. 4 graphically shows the quantity of light absorption in a central stripe area and in N-type GaAs current blocking layers of the first embodiment.

FIG. 4 shows the quantity of light absorption in the central stripe area 6a and in the N-type GaAs current blocking layers 6. As shown in the figure, since the quantity of light absorption is different between the N-type GaAs current blocking layers 6 and the second and third clad layers 5 and 7 constituting the P-type ZnSe layer because of the difference in refractive index therebetween, the central stripe area 6a forms a trough of light absorbance to function as a light guiding path in the horizontal direction. Therefore, the spread of light in the horizontal direction can be controlled by adjusting a width B of the central stripe area 6a.

Figure 5:
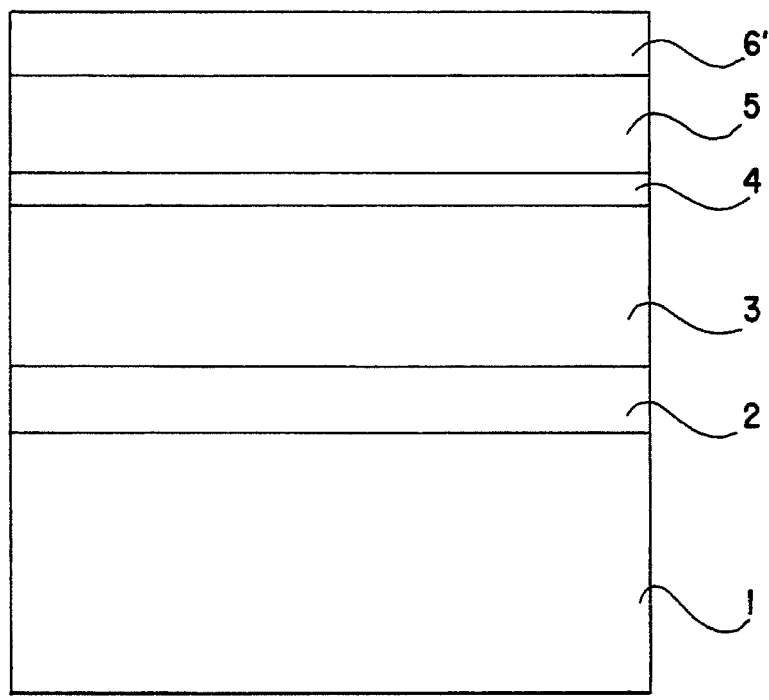
FIG. 5 is a cross-sectional view schematically showing a condition where the GaAs current blocking layer is formed in the manufacturing process of the first embodiment.
Figure 6:
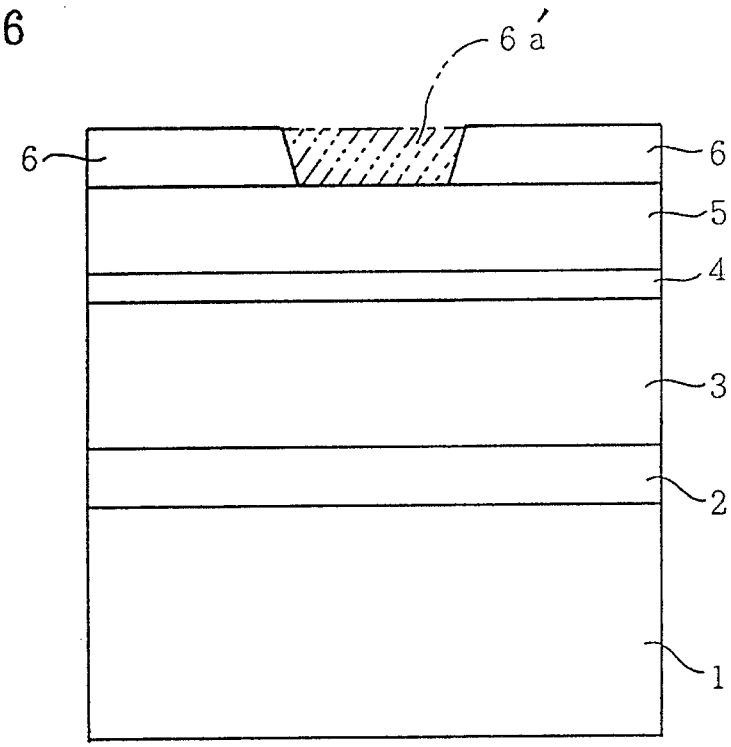
FIG. 6 is a cross-sectional view schematically showing a condition where the central stripe area is formed by etching the GaAs current blocking layer in the manufacturing process of the first embodiments.
Figure 7:
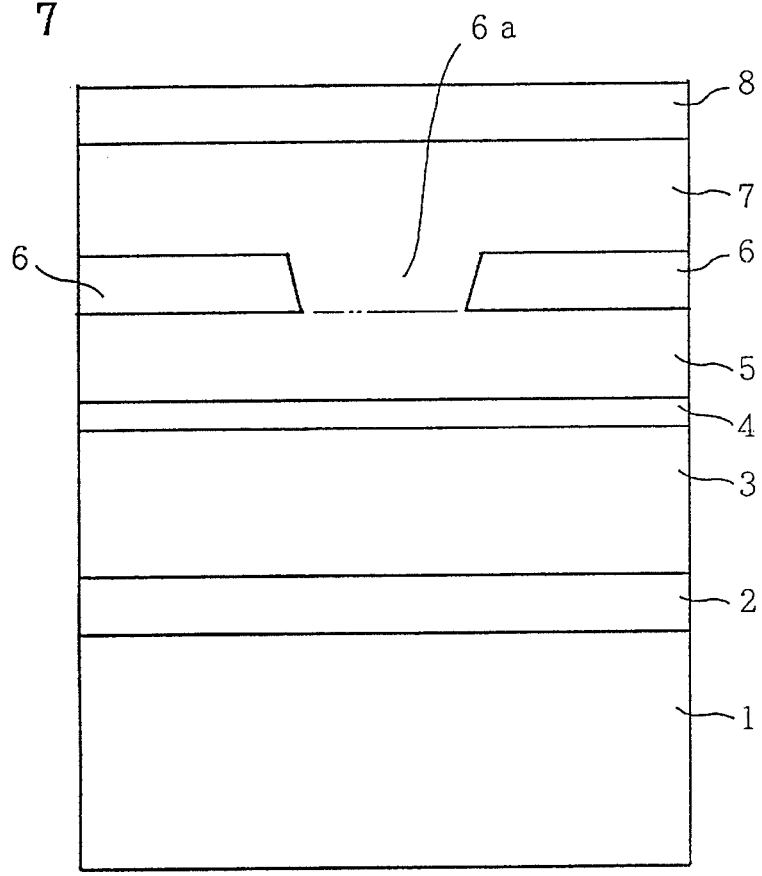
FIG. 7 is a cross-sectional view schematically showing a condition where a third clad layer is formed after the etching of the central stripe area in the manufacturing process of the first embodiment.

FIGS. 5, 6 and 7 sequentially show an example of a process for manufacturing the device in this embodiment. First, the group II-VI semiconductor is epitaxially grown on the N-type GaAs substrate 1 at a predetermined substrate temperature (e.g. 350° C. ) to form the N-type buffer layer 2, the N-type first clad layer 3, the active layer 4 and the thin P-type second clad layer 5 in this order in lamination.

Then, N-type GaAs is epitaxially grown on the entire surface of the second clad layer 5 to form an N-type GaAs layer 6'. The growth of the N-type GaAs layer 6' is performed at a substrate temperature lower than the substrate temperature at which the group II-VI semiconductor is grown. By growing the N-type GaAs layer 6' at a lower substrate temperature, the N-type GaAs layer 6' is prevented from being diffused into the group II-VI semiconductor film to form a highly electrically resistant alloy layer. As a result, the deterioration of the group II-VI semiconductor film is prevented.

Then, as shown in FIG. 6, after forming the pattern of the N-type GaAs current blocking layers 6 by photolithography, only an area 6a' (hatched portion in the figure) in the N-type GaAs layer 6' corresponding to the central stripe area 6a is etched to form the N-type GaAs current blocking layer 6 on each side of the central stripe area 6a.

Figure 8:
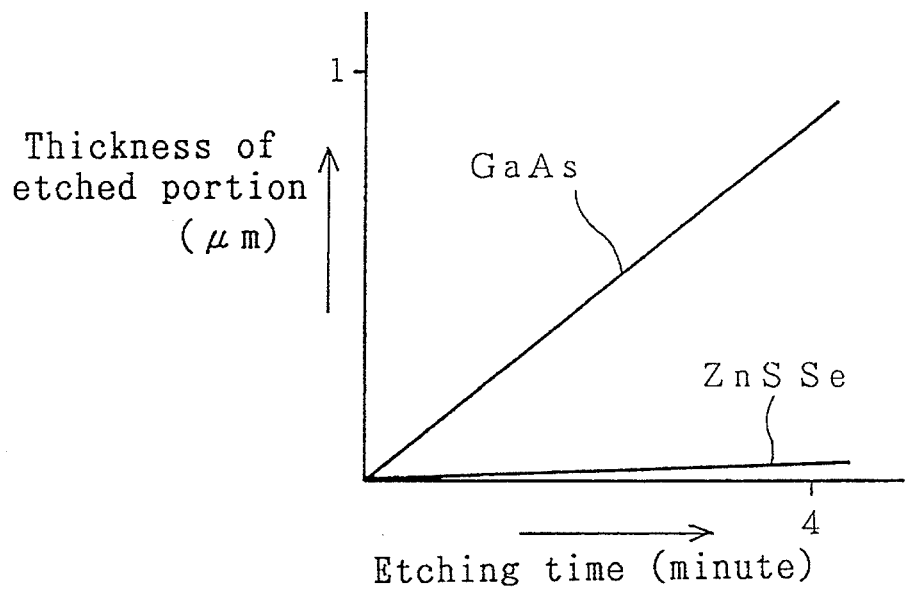
FIG. 8 graphically shows the etching speeds of GaAs and ZnSSe.

FIG. 8 shows a relationship between the etching time and the etched quantity of GaAs and ZnSSe when an ammonia, hydrogen peroxide etchant is used. As shown in the figure, ZnSSe which is a group II-VI semiconductor constituting the second clad layer 5 is hardly eroded in four minutes, whereas GaAs constituting the current blocking layers 6 is effectively eroded in proportion to the etching time; it is eroded by approximately 1 μm in four minutes.

Thus, the ammonia, hydrogen peroxide etchant is suitable for removing a part of the N-type GaAs layer 6' grown on the group II-VI semiconductor layer since only GaAs is etched by regulating the etching time because of the large difference in etching speed between GaAs and group II-VI semiconductor.

After the N-type current blocking layers 6 are formed in this manner, as shown in FIG. 7, P-type ZnSSe which is a group II-VI semiconductor is epitaxially grown on the current blocking layer 6 and on a portion of the second clad layer 5 which is exposed to the central stripe area 6a, thereby forming the third clad layer 7 which is integrated with the second clad layer 5 at the central stripe area 6a.

Then, on the third clad layer 7, P-type ZnSe which is a group II-VI semiconductor is epitaxially grown to form the electrode contact layer 8. The growth of the third clad layer 7 and the electrode contact layer 8 can be performed at a substrate temperature similar to the substrate temperature at which the second clad layer 5 is formed.

In this embodiment, since the current is concentrated on the central light emitting area 4a of the active layer 4 because of the presence of the current blocking layers 6, no problem is caused even if the electrode 9 is formed on the entire surface of the electrode contact layer 8.

Figure 9:
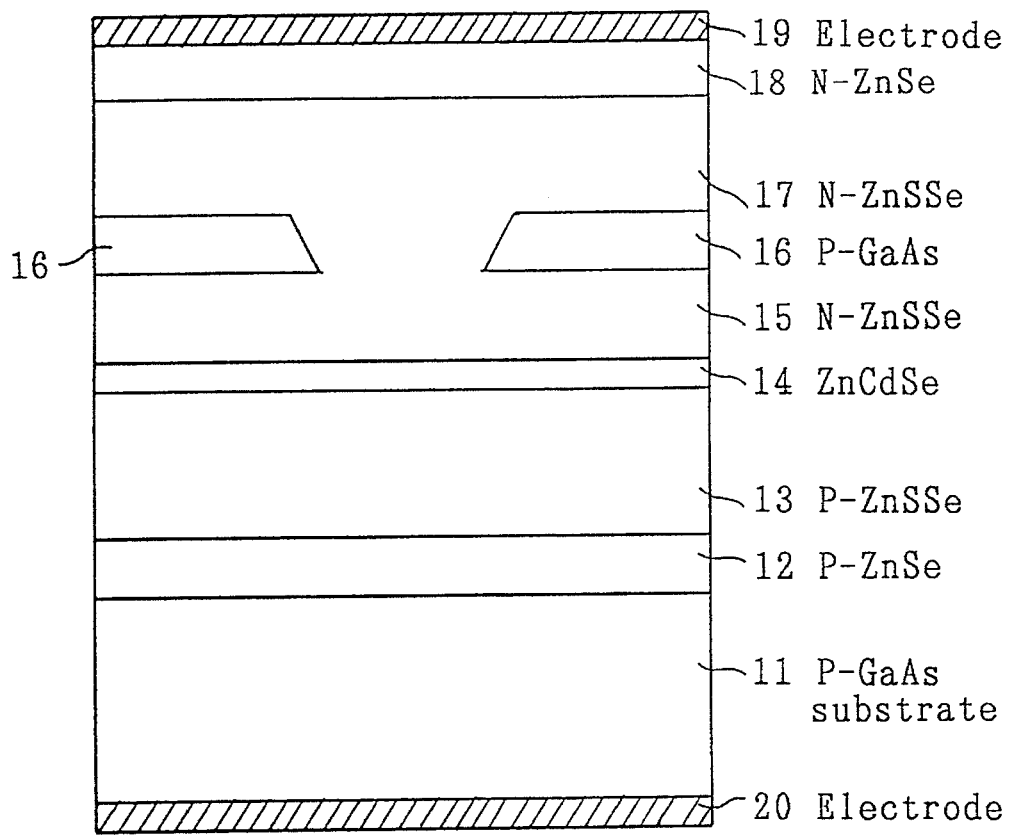
FIG. 9 is a cross-sectional view schematically showing the structure if a second embodiment of the present invention.

FIG. 9 shows as a second embodiment a semiconductor laser device where a P-N junction structure is grown on a P-type GaAs substrate 11. Specifically, as shown in FIG. 9, a buffer layer 12 made of P-type ZnSe, a first clad layer 13 made of P-type ZnSSe, an active layer 14 made of ZnCdSe and a second clad layer 15 of N-type ZnSSe are formed in this order on the P-type GaAs substrate 11.

On the second clad layer 15, a third clad layer 17 made of N-type ZnSSe is formed with P-type GaAs current blocking layers 16 between. On the third clad layer 17, an electrode contact layer 18 made of N-type ZnSe is formed. Reference numerals 19 and 20 represent electrodes formed on the outer surfaces of the electrode contact layer 18 and the P-type GaAs substrate 11, respectively.

As described above, the present invention may be employed in a semiconductor laser device where a group II-VI semiconductor film is grown on the P-type GaAs substrate 11. In this case, the current blocking layers 16 are made of P-type GaAs in contrast to the N-type clad layers 15 and 17.

While the group II-VI semiconductor film is made of a semiconductor of ZnCdSSe in the above-described embodiments, the same workings and advantages are obtained when the semiconductor film is made of a semiconductor of MgZnCdSSe.

As described above, according to the present invention, the current flowing between the electrodes are concentrated on the central light emitting area of the active layer. Further, since the GaAs current blocking layers and the active layer are close to each other, most of the current is made to contribute to the light emission by effectively restraining the spread of the current. Thereby, the emission efficiency remarkably increases to reduce the power consumption. Since the generation of heat from the device due to excessive leakage current is largely reduced, an excellent temperature characteristic is realized.

Since the central stripe area between the current blocking layers functions as a light guiding path in the horizontal direction, the guiding of the light is easily controlled only by adjusting the width of the central stripe area. As a result, a spread characteristic of light necessary for the device is readily and easily realized.

In addition, since the current is concentrated on the central light emitting area of the active layer because of the presence of the current blocking layers, the electrode may be formed on the entire surface of the group II-VI electrode contact layer. In this case, since the electrode contact layer and the electrode are in contact with each other at a larger area, less resistance is generated there. As a result, the generation of heat from the device is further reduced.

Obviously, many modification and variations of the present invention are possible in light of the above teachings. It is therefore to be understood that within the scope of the appended claims, the invention may be practiced other than as specifically described.

What is claimed is:

1. A semiconductor light emitting device comprising:

a GaAs substrate of a first conductivity type;

a first clad layer comprising a group II-VI semiconductor of the first conductivity type;

an active layer comprising a group II-VI semiconductor, said active layer formed on the first clad layer;

a second clad layer comprising a group II-VI semiconductor of a second conductivity type opposite to the first conductivity type, said second clad layer formed on the active layer;

a current blocking layer comprising a group III-V semiconductor of the first conductivity type, said current blocking layer formed on the second clad layer so that a central stripe area of the second clad layer is not covered by said current blocking layer; and a third clad layer comprising a group II-VI semiconductor of the second conductivity type, said third clad layer formed on the current blocking layer and the central stripe area of the second clad layer.

2. A semiconductor light emitting device according to claim 1, wherein said active layer is made of ZnCdSe.

3. A semiconductor light emitting device according to claim 1, wherein said active layer is made of MgZnCdSe.

4. A semiconductor light emitting device according to claim 1, wherein said current blocking layer is made of GaAs.

5. A semiconductor light emitting device according to claim 1, wherein said second clad layer is formed to be less than 0.5 µm in thickness.

* * * * *

UNITED STATES PATENT AND TRADEMARK OFFICE
CERTIFICATE OF CORRECTION

PATENT NO. : 5,477,063
DATED : December 19, 1995
INVENTOR(S) : Shakuda

It is certified that error appears in the above-indentified patent and that said Letters Patent is hereby corrected as shown below:

Title page, item [54], line 2, change "II-IV" to read —II-VI—
Column 1, lines 1 - 2, should read —SEMICONDUCTOR LIGHT EMITTING DEVICE WITH GROUP II-VI AND III-V SEMICONDUCTORS—

Signed and Sealed this

Twenty-third Day of April, 1996

Attest:

BRUCE LEHMAN

Attesting Officer

Commissioner of Patents and Trademarks